United States Patent
Zehavi

(12) 
(10) Patent No.: US 6,225,594 B1
(45) Date of Patent: May 1, 2001

(54) METHOD AND APPARATUS FOR SECURING COMPONENTS OF WAFER PROCESSING FIXTURES

(75) Inventor: Raanan Zehavi, Sunnyvale, CA (US)

(73) Assignee: Integrated Materials, Inc., San Jose, CA (US)

( * ) Notice: Subject to any disclaimer, the term of this patent is extended or adjusted under 35 U.S.C. 154(b) by 0 days.

(21) Appl. No.: 09/292,491

(22) Filed: Apr. 15, 1999

(51) Int. Cl.[7] ............................. B23K 26/22; C23C 16/00
(52) U.S. Cl. ................ 219/121.64; 118/728; 219/121.63
(58) Field of Search ......................... 219/121.63, 121.64; 118/724, 728

(56) References Cited

U.S. PATENT DOCUMENTS

| | | | |
|---|---|---|---|
| D. 404,371 | 1/1999 | Shimazu | D13/182 |
| D. 411,176 | 6/1999 | Shimazu | D13/182 |
| 3,247,576 | 4/1966 | Dill et al. | 29/155.5 |
| 3,901,423 | 8/1975 | Hillberry et al. | 225/2 |
| 4,177,789 | 12/1979 | Marocco | 125/1 |
| 4,318,749 | 3/1982 | Mayer | 134/25.4 |
| 4,566,839 | 1/1986 | Butler | 414/404 |
| 4,872,554 | 10/1989 | Quernemoen | 206/454 |
| 4,911,002 | 3/1990 | Enderlin et al. | 73/153 |
| 4,914,269 | 4/1990 | Kinsman et al. | 219/121.64 |
| 4,955,357 | 9/1990 | Takeguchi et al. | 125/23.01 |
| 4,966,549 | 10/1990 | Ohdate | 532/253 |
| 5,020,476 | 6/1991 | Bay et al. | 118/728 |
| 5,468,297 | 11/1995 | Letort | 118/728 |
| 5,492,229 * | 2/1996 | Tanaka et al. . | |
| 5,534,074 | 7/1996 | Koons | 118/728 |
| 5,586,880 | 12/1996 | Ohsawa | 432/241 |
| 5,595,604 | 1/1997 | Kobayashi et al. | 118/715 |
| 5,658,103 | 8/1997 | Inokuchi et al. | 408/145 |
| 5,752,609 | 5/1998 | Kato et al. | 211/41.18 |
| 5,779,797 | 7/1998 | Kitano | 118/500 |
| 5,820,683 | 10/1998 | Ishii et al. | 118/728 |
| 5,858,103 | 1/1999 | Nakajima et al. | 118/728 |
| 5,863,334 * | 1/1999 | Chou et al. | 118/728 |
| 5,915,370 | 6/1999 | Casper | 125/13.01 |
| 5,921,773 | 7/1999 | Lee | 423/258 |
| 5,931,666 | 8/1999 | Hengst | 432/258 |
| 6,065,615 * | 5/2000 | Uchiyama et al. | 118/724 |

FOREIGN PATENT DOCUMENTS

| | | | |
|---|---|---|---|
| 0506052A1 | 9/1992 | (EP) . | |
| 0793260A1 | 9/1997 | (EP) . | |
| 63-313684 * | 12/1988 | (JP) | 219/121.64 |
| 1630907 A1 | 2/1991 | (RU) . | |
| 00/21119 | 4/2000 | (WO) . | |

OTHER PUBLICATIONS

"Information about Silicon Furnace Tubes," Dow Corning, no date, 4 pp.

"Polyboat: Series 7700," Semiconductor Specialities Corp., no date, pp. 1–24.

"1979 Corning Supplement," Semiconductor Specialities Corp., no date, 3 pp.

* cited by examiner

*Primary Examiner*—Geoffrey S. Evans
(74) *Attorney, Agent, or Firm*—Charles S. Guenzer; Patrick N. Burkhart

(57) ABSTRACT

A silicon wafer processing fixture is made by providing a first silicon member with an outwardly extending attachment element. A second silicon member is provided with an attachment element receiving portion receives the extending attachment element of the first member which are then fixedly secured. The step of fixedly securing the members together can be accomplished by providing a first transverse bore in the attachment element and a second transverse bore in the attachment element receiving portion. The two bores are aligned, and a locating pin is used to secure the elements together. Alternatively, laser energy can be applied or adhesive to fixedly secure the elements together.

26 Claims, 2 Drawing Sheets

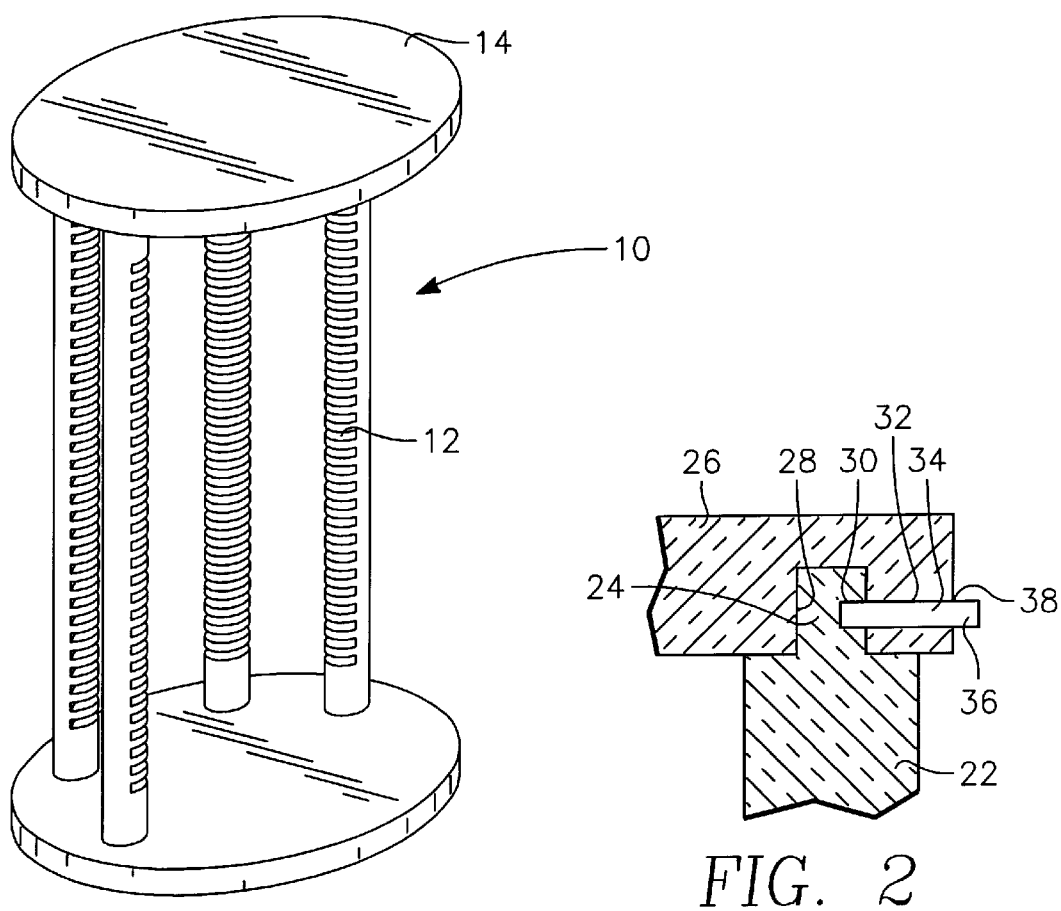
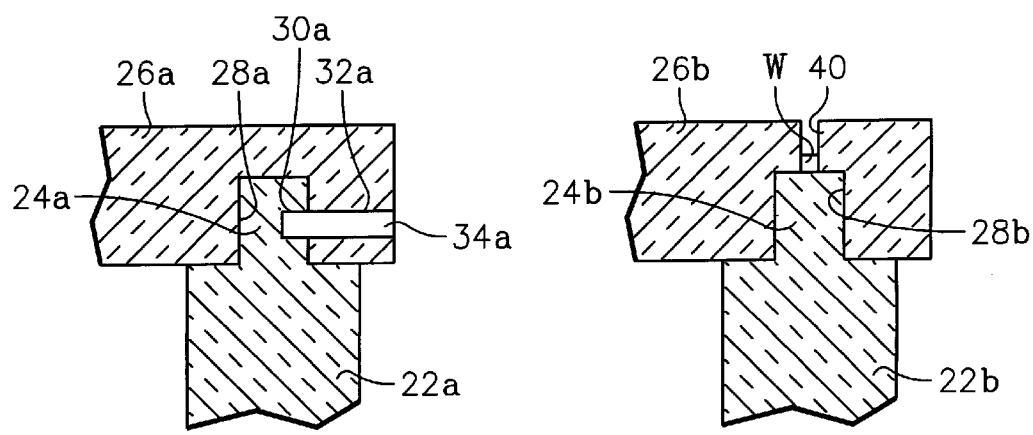
FIG. 1
FIG. 2
FIG. 3
FIG. 4

METHOD AND APPARATUS FOR SECURING COMPONENTS OF WAFER PROCESSING FIXTURES

CROSS-REFERENCE TO RELATED APPLICATIONS

This application is related to Ser. No. 09/292,495 and Ser. No. 09/292,496 both filed of even date herewith, Apr. 15, 1999, the specifications of which are incorporated by reference herein.

FIELD OF THE INVENTION

The present invention relates generally to securing components of wafer processing fixtures. Specifically, the present invention relates to securing various silicon members together in the construction of large or complex wafer processing fixtures.

BACKGROUND OF THE INVENTION

In the fabrication of semiconductor wafers it is often necessary to hold the wafers in precise positions during various processing steps. Relatively large and complex structures such as "boats" or "towers" are typically employed to that end. One example of such a structure is described in U.S. Pat. No. 5,492,229 to Tanaka et al. The Tanaka et al. patent is directed to a vertical boat for holding a plurality of semiconductor wafers. The boat includes two end members and a plurality of support members. In one embodiment, the support members are formed from pipe members cut vertically to provide a long plate member having a cross section of a quarter-circular arc. In another embodiment, the support members are formed from pipe members cut vertically to provide a long plate member having a cross section of a semicircular arc. The Tanaka et al. patent lists as potential materials for its boats the following: silica glass, silicon carbide, carbon, monocrystal silicon, polycrystal silicon, and silicon carbide impregnated with silicon. The various components are to be welded together if made from silica glass; otherwise, "they may be assembled in a predetermined manner".

U.S. Pat. No. 5,534,074 to Koons is directed to a vertical boat for holding semiconductor wafers. The boat includes a plurality of rods having slots cut along their lengths. The configuration of the slots is intended to reduce shadowing on wafers placed within the boat during processing. The rods are cylindrical, and are specified as being made from fused quartz, although "any known material suitable for holding wafers may be used."

U.S. Pat. No. 4,872,554 to Quernemoen shows a reinforced carrier for silicon wafers and the like. The carrier includes side components consisting of tubular rails with wafer spacing and supporting teeth projecting therefrom. The rails are made from plastic, and may be provided with rigid inserts for stiffening purposes. The teeth can be integrally molded with, or fused to, the rails.

U.S. Pat. No. 5,752,609 to Kato et al. is directed to a wafer boat including a plurality of rods arranged to support ring members. A plurality of wafer supporting pieces are associated with the ring members, and include angular projections for contacting the wafers. The Kato et al. patent also illustrates a wafer boat having a plurality of cylindrical quartz rods having wafer support recesses formed therein.

The theoretical advantages provided by pure silicon structures are well known. Conventional towers and boats are typically made from quartz or silicon carbide, which introduce contamination and become unstable at higher temperatures. By fabricating wafer holding structures from the same materials as the wafers themselves, the possibility of contamination and deformation is minimized. The structure would react to processing temperatures, conditions, and chemistry in exactly the same way that the wafers would, thus greatly enhancing the overall effective useful life of the structure.

Unfortunately, standard assembly of silicon structures in a "predetermined manner" as set forth in Tanaka et al. is one of the reasons that pure silicon has not gained wide acceptance as a material for structures such as boats and towers. The difficulties of working with monocrystalline silicon, polycrystalline silicon, and virgin polycrystalline have led to the development of structures such as that shown in Tanaka et al., wherein, when considering monocrystalline silicon as the material of choice, the connections between the support members and the end members are not described at all, and the only specifically described method of fabricating support structures involves cutting extruded tubular members. Such support structures are inherently less stable than those made from more traditional and easily-worked materials such as quartz or silicon carbide.

Similarly, the patents to Koons, Quernemoen, and Kato et al. fail to address the specific problems of providing a strong, reliable wafer support structure that reduces shadowing and contamination. The projections and slots described in these patents, while effective to some extent, are either not suited for fabrication from materials such as silicon, or require a relatively large cross-sectional area to provide stable and precise wafer support.

Silicon is perceived as being extremely fragile and difficult to fuse. Due to these perceptions, known silicon structures are widely believed to be delicate at best, and unreliably flimsy at worst. Consequently, they have failed to receive broad commercial acceptance.

It can thus be seen that the need exists for a strong, reliable support member for wafer processing fixtures that will reduce shadowing and contamination while providing stable and precise wafer support.

SUMMARY OF THE INVENTION

A method of securing a first silicon member to a second silicon member to form at least a part of a silicon wafer processing fixture is disclosed, as is the silicon wafer processing fixture itself. The method includes the step of providing a first silicon member with an outwardly-extending attachment element. A second silicon member is provided, with an attachment element receiving portion adapted to at least partially enclose the attachment member. The attachment element is then fixedly secured within the attachment element receiving portion.

In an embodiment, the step of fixedly securing the attachment element can be accomplished by providing a first transverse bore in the attachment element and a second transverse bore in the attachment element receiving portion. The first and second transverse bores are coaxial with one another, and adapted to receive a locating pin. Once the first and second bores are coaxially aligned with one another, the locating pin is secured in the first and second transverse bores. The pin can be provided with a length slightly greater than the combined length of the first and second bores, in which instance the pin can be secured in the following manner. First, the locating pin is inserted in the aligned bores such that a portion of the locating pin extends outwardly from an outer limit of the first and second bores. Next, the extending portion of the locating pin is machined off flush with the outer limit of the first and second bores. Alternatively, the locating pin can be provided with an outer diameter substantially equal to an inner diameter of the first and second bores, in which instance the pin can be secured in the following manner. First, the locating pin is cryogenically frozen, causing the locating pin to contract. Next, the locating pin is inserted in the aligned bores while maintaining the bores at ambient or higher temperature. Then, the locating pin is caused to expand by allowing the locating pin to return to ambient temperature.

In an alternative securing step, energy can be applied to at least one of the attachment element and the attachment element receiving portion to fuse the attachment element to the attachment element receiving portion. In an embodiment, the attachment element receiving portion of the second silicon member is provided with an access bore. Laser energy is applied through the access bore to form a tack weld between the attachment element and the attachment element receiving portion. Alternatively, the attachment element and the attachment element retaining portion can be substantially coextensive. Laser energy can be applied to an area adjacent to both the attachment element and the attachment element receiving portion.

In yet another embodiment, the first silicon member is provided with a peripheral ridge at its terminal end. The second silicon member is provided with a peripheral trench at its terminal edge. Laser energy is applied to cause the peripheral ridge of the first silicon member to melt into the peripheral trench of the second silicon member. Laser energy is applied to heat the ridge to a temperature of approximately 1450° C. for approximately 3 minutes, or until the silicon melt has filled the peripheral trench.

In still another embodiment, the step of fixedly securing the attachment element within the attachment element receiving portion includes the step of applying a high-bond, non-contaminating adhesive between the attachment element and the attachment element receiving portion.

The attachment element can be generally cylindrical, with the attachment element receiving portion being formed as a cylindrical bore having a diameter and length corresponding to those of the attachment element. The first and second silicon members can be formed from monocrystalline silicon, polycrystalline silicon, or virgin polysilicon.

A silicon wafer processing fixture is also provided. The fixture includes a generally elongate silicon support member having an attachment element extending outwardly from a terminal end thereof. The fixture is also provided with a generally planar silicon base. The base includes an attachment element receiving portion having the attachment element of the support member fixedly secured therein.

DESCRIPTION OF THE DRAWINGS

FIG. 1 illustrates a perspective view of a silicon wafer processing fixture incorporating the principles of the present invention.

FIGS. 2 through 8 illustrate sectional views showing techniques for securing the components of silicon wafer processing fixtures.

DETAILED DESCRIPTION OF THE INVENTION

Figure 5:
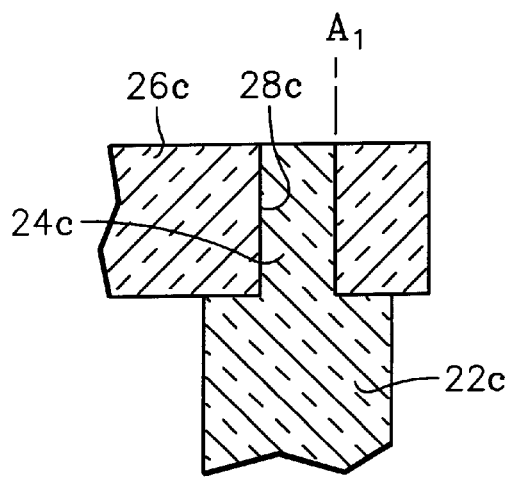

A silicon wafer processing fixture 10 is shown in FIG. 1. The silicon wafer processing fixture 10 includes a plurality of generally elongate support members 12 secured between a pair of generally planar base members 14. The support members 12 and the base members 14 can be fabricated from an inert crystalline material, such as monocrystalline or polycrystalline silicon, and can be fabricated in any suitable manner. The illustrated support members 12 can be produced advantageously in accordance with the methods and apparatus described in U.S. patent applications Ser. Nos. 09/292,495 and 292,496, issues fees paid.

Various techniques for securing the support members to the base members are illustrated in FIGS. 2 through 8. In each of these examples, As shown in FIG. 2, a first silicon member 22, here shown as the support member, is provided with an outwardly-extending attachment element 24. A second silicon member 26, here the base member, is provided with an attachment element receiving portion 28. The receiving portion 28 is adapted to at least partially enclose the attachment element 24.

To fixedly secure the attachment element 24 within the attachment element receiving portion 28, a first transverse bore 30 is provided in the attachment element, and a second transverse bore 32 is provided in the attachment element receiving portion 28. The first transverse bore 30 and the second transverse bore 32 are adapted to receive a locating pin 34 when coaxially aligned with one another.

The locating pin 34 can be secured in the first and second transverse bores in several ways. In the FIG. 2 embodiment, the locating pin 34 is slightly longer than the combined lengths of the first and second bores. The locating pin 34 is inserted in the aligned bores 30, 32 such that a portion 36 of the locating pin (shown in broken line) extends outwardly from an outer limit 38 of the first and second bores. Next, the extending portion 36 of the locating pin 34 is machined off flush with the outer limit 38 of the first and second bores 30, 32.

An alternative securing technique is illustrated in FIG. 3, wherein a locating pin 34a is provided with an outer diameter D1 substantially equal to the inner diameter D2 of the first and second bores 30', 32'. In this example, the locating pin 34a is cryogenically frozen to approximately −100° C., thus causing the locating pin to contract. Next, the locating pin 34a is inserted in the aligned bores 30a, 32a while maintaining the bores at ambient temperature. Then, the locating pin 34a, is caused to expand by allowing it to return to ambient temperature. The diameter of the locating pin 34a contracts approximately 0.001% when cryogenically frozen.

As an alternative to the techniques incorporating locating pins, energy can be applied to the attachment element, the attachment element receiving portion, or both to fuse the attachment element to the attachment element receiving portion.

One example of such a technique is shown in FIG. 4. In this example, the attachment element receiving portion 28a of the second silicon member 26' is provided with an access bore 40. Laser energy is applied through the access bore 40 to form a tack weld W between the attachment element 24a and the attachment element receiving portion 28a. It has been found that advantageous results are achieved with laser energy from a 250 watt $CO_2$ laser having a pulse width of 30 ns and a pulse period of 0.001 sec, applied for 1–5 minutes. Any suitable source of laser energy may be employed, such as a $CO_2$ laser manufactured by Coherent.

Another example is illustrated in FIG. 5. In this example, the attachment element 24b and the attachment element retaining portion 28b are substantially coextensive. Laser energy can be applied to an area A adjacent to both the attachment element and the attachment element receiving portion to form a tack weld, which can extend around all or part of the area A. Any suitable source of laser energy may be employed, such as a $CO_2$ laser manufactured by Coherent.

Figure 6:
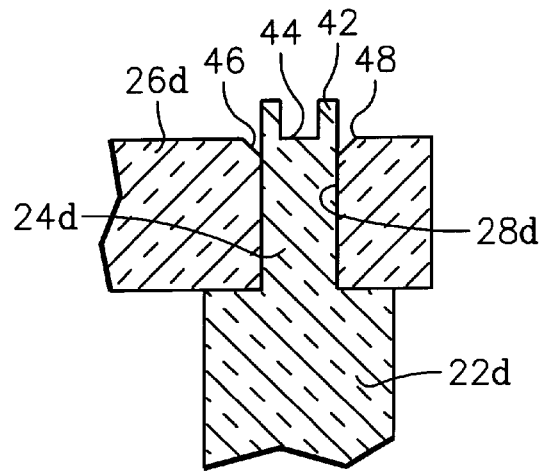
Figure 7:
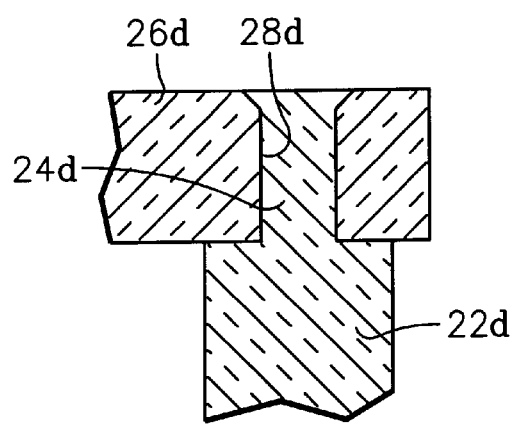

In the examples shown in FIGS. 6 and 7, an attachment member 24c includes a peripheral ridge 42 at its terminal end 44. The attachment element receiving portion 28c of the second silicon member 26c is provided with a peripheral trench 46 at its terminal edge 48. Heat energy is applied to cause the peripheral ridge 42 of the first silicon member 22c to melt into the peripheral trench 46 of the second silicon member 26c, thus fusing the attachment element 24c to the attachment element receiving portion 28c. Any suitable heat source can be used to apply heat. It has been found that one heat source that can be used advantageously is heat generated from laser energy. Laser energy is used to heat the ridge 42 to a temperature of approximately 1450° for approximately 3 minutes, or until the silicon melt has filled the peripheral trench 46.

Figure 8:
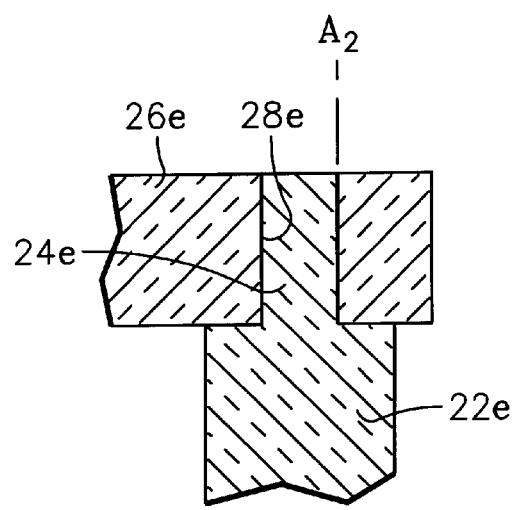

Another securing technique is shown in FIG. 8. In this example, the step of fixedly securing the attachment element 24d within the attachment element receiving portion 28d includes the step of applying adhesive at an area A2 between the attachment element and the attachment element receiving portion. In order to avoid contamination usually associated with the use of adhesives, a high-temperature, non-contaminating adhesive should be used.

The attachment elements illustrated in FIGS. 1 through 8 are shown as being generally cylindrical, with the attachment element receiving portions being formed as a cylindrical bores. It is to be understood, however, that these configurations are for exemplary purposes only, and that any suitable cooperating shapes may be chosen for the attachment elements and associated retaining portions.

The present invention enables the fabrication of monocrystalline silicon, polycrystalline silicon, or virgin polysilicon structural members for use in the manufacture of semiconductor wafers and the like, and is applicable to any large scale and/or complex fixture or part used in the processing of silicon wafers. Components using structural members in accordance with the present invention eliminate deformation during high-temperature process applications. Since the source material is the same quality as the wafers material, particulate contamination and "crystal slip" inherent with known materials such as silicon carbide is virtually eliminated. Furthermore, there is no shadowing, since the source material provides a one-to-one duplication of the physical properties and critical constants of process wafers. Monosilicon fixtures and parts provide tolerances and expected service life unachievable with those made from commonly-used materials such as quartz or silicon carbide. The present invention enables the fabrication of silicon parts and fixtures that provide advantages as the industry moves to 300 mm and larger wafer diameters.

Although the present invention has been described with reference to specific embodiments, those of skill in the art will recognize that changes may be made thereto without departing from the scope and spirit of the invention.

What is claimed is:

1. A method of securing a first silicon member to a second silicon member to form at least a part of a silicon wafer processing fixture, the method comprising the following steps:

providing a first silicon member;

providing a second silicon member with a receiving portion adapted to at least partially enclose an end of the first silicon member, wherein at least one of the first and second silicon members is composed of virgin polysilicon;

placing the end of the first silicon member into the receiving portion; and fixedly securing the end of the first silicon member within the receiving portion.

2. A method according to claim 1, wherein the first silicon member is provided with a generally cylindrical terminal end, and the second silicon member is provided with a generally annular terminal edge, and further wherein:

the step of providing the first silicon member comprises providing the first silicon member with a peripheral ridge at its terminal end;

the step of providing the second silicon member comprises providing the second silicon member with a peripheral trench at its terminal edge; and the step of fixedly securing comprises applying heat energy sufficient to cause the peripheral ridge of the first silicon member to melt into the peripheral trench of the second silicon member.

3. A method according to claim 2, wherein the step of applying heat energy comprises applying heat energy with a laser to heat the ridge to a temperature of approximately 1450° C. for approximately 3 minutes.

4. A method according to claim 1, wherein the step of fixedly securing the end of the first silicon member into the receiving portion comprises applying adhesive between the end of the first silicon member and the receiving portion.

5. The method of claim 1, wherein the step of fixedly securing comprises applying energy to at least one of the first and second silicon members to fuse the end of the first silicon member to the second silicon member.

6. A method of securing a first silicon member to a second silicon member to form at least a part of a silicon wafer processing fixture, the method comprising the following steps:

providing a first silicon member with an outwardly-extending attachment element;

providing a second silicon member with an attachment element receiving portion adapted to at least partially enclose the attachment member;

placing the attachment element into the attachment element receiving portion; and fixedly securing the attachment element within the attachment element receiving portion, wherein the step of fixedly securing the attachment element to the attachment element receiving portion comprises the following substeps of:

providing a first transverse bore in the attachment element;

providing a second transverse bore in the attachment element receiving portion, the first and second transverse bores being coaxial with one another;

providing a locating pin adapted to fit into the first and second transverse bores; contiguously aligning the first and second bores with one another; and securing the locating pin in the first and second transverse bores.

7. A method according to claim 6, wherein the locating pin is provided with a length slightly greater than the combined length of the first and second bores, and the step of securing the locating pin in the first and second transverse bores comprises the following steps:

inserting the locating pin in the aligned bores such that a portion of the locating pin extends outwardly from an outer limit of the first and second bores; and machining off the extending portion of the locating pin flush with the outer limit of the first and second bores.

8. A method according to claim 6, wherein the locating pin is provided with an outer diameter substantially equal to an inner diameter of the first and second bores, and the step of securing the locating pin in the first and second transverse bores comprises the following steps:

cryogenically freezing the locating pin to cause the locating pin to contract;

inserting the locating pin in the aligned bores while maintaining the bores at ambient temperature; and causing the locating pin to expand by allowing the locating pin to return to ambient temperature.

9. A method of securing a first silicon member to a second silicon member to form at least a part of a silicon wafer processing fixture, the method comprising the following steps:

providing a first silicon member with an outwardly-extending attachment element, including providing a first silicon member with a generally cylindrical outwardly-extending attachment element;

providing a second silicon member with an attachment element receiving portion adapted to at least partially enclose the attachment member and formed as a cylindrical bore having a diameter and length corresponding to those of the generally cylindrical attachment element;

placing the attachment element into the attachment element receiving portion; and fixedly securing the attachment element within the attachment element receiving portion.

10. A method according to claim 9, wherein the first and second silicon members are formed from crystalline silicon.

11. A method according to claim 10, wherein the first and second silicon members are formed from a material selected from a group consisting of monocrystalline silicon, polycrystalline silicon, and virgin polysilicon.

12. A method of securing a first silicon member to a second silicon member to form at least a part of a silicon wafer processing fixture, the method comprising the following steps:

providing a first silicon member with an outwardly-extending attachment element;

providing a second silicon member with an attachment element receiving portion adapted to at least partially enclose the attachment member;

placing the attachment element into the attachment element receiving portion; and fixedly securing the attachment element within the attachment element receiving portion, comprising the substep of applying energy to at least one of the attachment element and the attachment element receiving portion to fuse the attachment element to the attachment element receiving portion.

13. A method according to claim 12, wherein the step of applying energy comprises applying laser energy.

14. A method according to claim 13, wherein:

the step of providing a second silicon member with an attachment element receiving portion comprises providing the attachment element receiving portion of the second silicon element with an access bore; and the step of applying laser energy comprises applying laser energy through the access bore to form a tack weld between the attachment element and the attachment element receiving portion.

15. A method according to claim 14, wherein the step of applying laser energy comprises applying laser energy from a 250 watt $CO_2$ laser having a pulse width of 30 ns and a pulse period of 0.001 sec, applied for 1–5 minutes.

16. A method according to claim 13, wherein the element and retaining portion are substantially coextensive, and the step of applying laser energy comprises applying laser energy to an area adjacent to both the attachment element and the attachment element receiving portion.

17. A method according to claim 16, wherein the step of applying laser energy comprises applying laser energy from a 250 watt $CO_2$ laser having a pulse width of 30 ns and a pulse period of 0.001 sec, applied for 1–5 minutes.

18. A method according to claim 12, wherein the step of providing a first silicon member with an outwardly-extending attachment element comprises providing a first silicon member with a generally cylindrical outwardly-extending attachment element, and the step of providing a second silicon member with an attachment element receiving portion comprises providing a second silicon member with an attachment element receiving portion formed as a cylindrical bore having a diameter and length corresponding to those of the generally cylindrical attachment element.

19. A method according to claim 12, wherein the first and second silicon members are formed from a material selected from a group consisting of monocrystalline silicon and polycrystalline silicon.

20. A silicon wafer processing fixture comprising the following:

a generally elongate silicon support member including a terminal end thereof;

a generally planar silicon base including a receiving portion having the terminal end of the support member fixedly secured therein;

wherein at least one of the silicon support member and the silicon base is composed of virgin polysilicon.

21. The fixture of claim 20, wherein the terminal end of the support member is fused to the receiving portion of the base.

22. In the assembly of a silicon wafer processing fixture having a generally elongate silicon support member and a generally planar silicon base member, a method for securing the support member to the base member, the method comprising the following steps:

providing a receiving portion on the base member, the receiving portion being adapted to at least partially enclose an end of the support member, wherein at least one of the support member and the base member is composed of virgin polysilicon;

placing the end of the support member into the receiving portion; and fixedly securing the end of the support member to the receiving portion.

23. The method of claim 22, wherein the step of fixedly securing comprises applying energy to at least one of the support member and the base to fuse the end of the support member to the receiving portion of the base.

24. A method of fabricating a silicon support structure comprising a plurality of a plurality of silicon support members each having a plurality of wafer support surfaces formed therein extending transversely to respective longitudinal axes thereof and two silicon ends, said method comprising the steps of:

forming receiving portions in each of said silicon ends adapted to receive ends of said silicon support members;

placing opposed ends of each of said silicon support members into said receiving portions of respective ones of said ends; and fixedly securing each said silicon support member to both of said ends by applying heat to at least one of said silicon support members and said end to fuse a respective silicon support member to a respective silicon end;

wherein at least one of said silicon support members and said silicon ends is composed of virgin polysilicon.

25. The method of claim 24, wherein all of said silicon support members and said silicon ends are composed of virgin polysilicon.

26. The method of claim 24, wherein said step of fixedly securing includes applying energy to at least one of the support members and the end to fuse said support member to each of said ends.

* * * * *